US011230765B2

(12) United States Patent
Wiltse

(10) Patent No.: US 11,230,765 B2
(45) Date of Patent: *Jan. 25, 2022

(54) ACTUATOR TO ADJUST DYNAMICALLY SHOWERHEAD TILT IN A SEMICONDUCTOR-PROCESSING APPARATUS

(71) Applicant: Lam Research Corporation, Fremont, CA (US)

(72) Inventor: John Wiltse, Lake Oswego, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/712,944

(22) Filed: Dec. 12, 2019

(65) Prior Publication Data

US 2020/0181776 A1      Jun. 11, 2020

Related U.S. Application Data

(63) Continuation of application No. 14/986,191, filed on Dec. 31, 2015, now Pat. No. 10,533,251.

(51) Int. Cl.
*C23C 16/455*    (2006.01)

(52) U.S. Cl.
CPC .. *C23C 16/45565* (2013.01); *C23C 16/45589* (2013.01)

(58) Field of Classification Search
CPC ................... C23C 16/45565; C23C 16/45589
(Continued)

(56) References Cited

U.S. PATENT DOCUMENTS

| 4,694,477 A | 9/1987 | Siddall |
| 6,229,264 B1 | 5/2001 | Ni et al. |

(Continued)

FOREIGN PATENT DOCUMENTS

| CN | 103597625 A | 2/2014 |
| CN | 103765177 A | 4/2014 |

(Continued)

OTHER PUBLICATIONS

U.S. Appl. No. 14/986,191, Advisory Action dated Mar. 20, 2019, 3 pgs.

(Continued)

*Primary Examiner* — Charlee J. C. Bennett
(74) *Attorney, Agent, or Firm* — Schwegman Lundberg & Woessner, P.A.

(57) ABSTRACT

In various embodiments, a showerhead mechanism to adjust a showerhead in a semiconductor substrate-processing apparatus is disclosed. The mechanism includes at least one actuator assembly that is dynamically operable to adjust parallelism of a faceplate of the showerhead with reference to an upper surface of a substrate pedestal that is to be positioned adjacent to the faceplate. Each of the actuator assemblies includes a piezoelectric stack and a lever having a first end and a second end. The lever is mechanically coupled on the first end to the piezoelectric stack and on the second end to the showerhead to displace the showerhead in at least one direction of tilt. The lever is operable to amplify mechanically a displacement of the piezoelectric stack. A lever pivot point is coupled to the lever and is located between the first end and the second end of the lever.

19 Claims, 7 Drawing Sheets

(58) Field of Classification Search
USPC .......................................... 118/722, 715–733
See application file for complete search history.

(56) References Cited

U.S. PATENT DOCUMENTS

| | | | |
|---|---|---|---|
| 6,466,324 B1* | 10/2002 | Doran | G01B 11/005 356/138 |
| 6,863,784 B2 | 3/2005 | Hao et al. | |
| 7,858,898 B2 | 12/2010 | Bailey, III et al. | |
| 8,213,178 B2 | 7/2012 | Chen et al. | |
| 8,257,548 B2 | 9/2012 | Tappan | |
| 8,394,233 B2 | 3/2013 | Tappan | |
| 8,431,033 B2 | 4/2013 | Zhou et al. | |
| 8,438,112 B2 | 5/2013 | Oh et al. | |
| 8,557,712 B1 | 10/2013 | Van Schravendijk et al. | |
| 8,580,697 B1 | 11/2013 | Lang et al. | |
| 8,869,741 B2 | 10/2014 | Fischer et al. | |
| 8,895,452 B2 | 11/2014 | Antolik et al. | |
| 9,290,843 B2 | 3/2016 | Madsen | |
| 9,293,305 B2 | 3/2016 | Avoyan et al. | |
| 10,190,216 B1 | 1/2019 | Luo et al. | |
| 10,533,251 B2* | 1/2020 | Wiltse | C23C 16/45565 |
| 2002/0021428 A1 | 2/2002 | Nakano et al. | |
| 2002/0138993 A1 | 10/2002 | Montesanti et al. | |
| 2002/0154669 A1* | 10/2002 | Spangler | G03F 7/70933 372/55 |
| 2003/0019580 A1 | 1/2003 | Strang | |
| 2004/0040502 A1 | 3/2004 | Basceri et al. | |
| 2004/0056932 A1 | 3/2004 | Blum | |
| 2005/0231075 A1 | 10/2005 | Xu | |
| 2005/0280314 A1 | 12/2005 | Jeanne et al. | |
| 2006/0060138 A1 | 3/2006 | Keller et al. | |
| 2008/0179297 A1* | 7/2008 | Bailey | H01L 21/0209 219/69.15 |
| 2009/0121399 A1 | 5/2009 | Hindle et al. | |
| 2009/0199665 A1 | 8/2009 | Tappan | |
| 2009/0199766 A1 | 8/2009 | Tappan | |
| 2009/0260571 A1 | 10/2009 | Ostrowski et al. | |
| 2010/0159703 A1 | 6/2010 | Fischer et al. | |
| 2010/0199914 A1 | 8/2010 | Iza | |
| 2011/0041769 A1 | 2/2011 | Lee | |
| 2011/0286122 A1* | 11/2011 | Halpin | G02B 27/149 359/896 |
| 2012/0291954 A1 | 11/2012 | Tappan | |
| 2012/0314269 A1 | 12/2012 | Takano et al. | |
| 2013/0005140 A1 | 1/2013 | Jeng et al. | |
| 2013/0176548 A1 | 7/2013 | Harb et al. | |
| 2013/0230987 A1 | 9/2013 | Draeger et al. | |
| 2013/0273262 A1* | 10/2013 | Vellaikal | C23C 16/54 427/569 |
| 2013/0316094 A1 | 11/2013 | Leeser et al. | |
| 2013/0319329 A1 | 12/2013 | Li et al. | |
| 2014/0283302 A1 | 9/2014 | Horstmann | |
| 2014/0285880 A1 | 9/2014 | Southard | |
| 2015/0010341 A1 | 1/2015 | Fricke et al. | |
| 2015/0221853 A1 | 8/2015 | Reuter | |
| 2015/0225854 A1 | 8/2015 | Madsen | |
| 2016/0016650 A1 | 1/2016 | Smith et al. | |
| 2017/0191160 A1 | 7/2017 | Wiltse | |
| 2020/0002815 A1* | 1/2020 | Agarwal | C23C 16/45565 |

FOREIGN PATENT DOCUMENTS

| | | |
|---|---|---|
| CN | 104862672 A | 8/2015 |
| CN | 107034445 A | 8/2017 |
| JP | S60154528 A | 8/1985 |
| JP | 0240594 A | 2/1990 |
| JP | 04109251 A | 4/1992 |
| JP | 0737785 A | 2/1995 |
| JP | 0745542 A | 2/1995 |
| JP | 2001358204 A | 12/2001 |
| JP | 2002184664 A | 6/2002 |
| JP | 2003529926 A | 10/2003 |
| JP | 2005142583 A | 6/2005 |
| JP | 2009121684 A | 6/2009 |
| JP | 2017143248 A | 8/2017 |
| KR | 20170080501 A | 7/2017 |

OTHER PUBLICATIONS

U.S. Appl. No. 14/986,191, Examiner Interview Summary dated Apr. 22, 2019, 3 pgs.

U.S. Appl. No. 14/986,191, Final Office Action dated Dec. 11, 2018, 28 pgs.

U.S. Appl. No. 14/986,191, Non Final Office Action dated May 31, 2018, 24 pgs.

U.S. Appl. No. 14/986,191, Notice of Allowance dated Sep. 5, 2019, 13 pgs.

U.S. Appl. No. 14/986,191, Response filed Feb. 9, 2018 to Restriction Requirement dated Dec. 11, 2017, 1 pg.

U.S. Appl. No. 14/986,191, Response filed Feb. 11, 2019 to Final Office Action dated Dec. 11, 2018, 31 pgs.

U.S. Appl. No. 14/986,191, Response filed May 13, 2019 to Advisory Action dated Mar. 20, 2019, 20 pgs.

U.S. Appl. No. 14/986,191, Response filed Aug. 31, 2018 to Non Final Office Action dated May 31, 2018, 21 pgs.

U.S. Appl. No. 14/986,191, Restriction Requirement dated Dec. 11, 2017, 5 pgs.

Nanopositioning Stages, [Online] Retrieved from the Internet : <http://www.npoint.com/products/nanopositioning-stages.html>, (Oct. 21, 2015), 8 pgs.

NPoint Company Information, [Online] Retrieved from the Internet : <http://www.npoint.com/company/company-information.html>, (Oct. 21, 2015), 1 pg.

PDu100 Specifications—Calculate Power Bandwidth, [Online] Retrieved from the Internet : <http://mmech.com/piezodrive-amplifiers/pdu100>, (Apr. 6, 2017), 6 pgs.

Piezo Stage—An Overview of nPoint Nanopositioning Stages, <http://www.npoint.com/products/piezostage.html>, (Oct. 21, 2015).

PiezoDrive—High-Performance Voltage and Charge Amplifiers for Driving Piezoelectric, [Online] Retrieved from the Internet : <http://piezodrive.com>, (Apr. 6, 2017), 2 pgs.

PiezoDrive—Products, [Online] Retrieved from the Internet : <http://piezodrive.com/actuators.html>, (Apr. 6, 2017), 4 pgs.

Sattler, Ricki, "Uniformity Enhancement Procedure for Processes Sensitive to Showerhead Parallelism", Novellus Systems, Inc., Technical Bulletin, VCTRB2605, (Sep. 29, 2005), 11 pgs.

U.S. Appl. No. 14/986,191 U.S. Pat. No. 10,533,251, filed Dec. 31, 2015, Actuator to Dynamically Adjust Showerhead Tilt in a Semiconductor Processing Apparatus.

"Chinese Application Serial No. 201611224666.0, Office Action dated Feb. 27, 2020", w/ English Translation, 19 pgs.

Chinese Application Serial No. 201611224666.0, Response filed Sep. 11, 2020 to Office Action dated Feb. 27, 2020, w/ English Claims, 7 pgs.

Japanese Application Serial No. 2016-247304, Notification of Reasons for Refusal dated Feb. 2, 2021, w/ English Machine Translation, 10 pgs.

Japanese Application Serial No. 2016-247304, Response filed Apr. 28, 2021 to Notification of Reasons for Refusal dated Feb. 2, 2021, w/ English claims, 22 pgs.

* cited by examiner

ACTUATOR TO ADJUST DYNAMICALLY SHOWERHEAD TILT IN A SEMICONDUCTOR-PROCESSING APPARATUS

CROSS-REFERENCE TO RELATED APPLICATIONS

This application is a continuation of and claims the benefit of priority under 35 U.S.C. § 120 to U.S. patent application Ser. No. 14/986,191, filed on Dec. 31, 2015, which is incorporated by reference herein in its entirety.

FIELD OF INVENTION

This invention pertains to semiconductor substrate processing apparatuses used for processing semiconductor substrates, and may find particular use in performing chemical vapor depositions of thin films.

BACKGROUND

Semiconductor substrate processing apparatuses are used to process semiconductor substrates by techniques including, physical vapor deposition (PVD), chemical vapor deposition (CVD), plasma enhanced chemical vapor deposition (PECVD), atomic layer deposition (ALD), plasma enhanced atomic layer deposition (PEALD), pulsed deposition layer (PDL), molecular layer deposition (MLD), plasma enhanced pulsed deposition layer (PEPDL) processing, etching, and resist removal. One type of semiconductor substrate processing apparatus used to process semiconductor substrates includes a reaction chamber containing a showerhead module and a substrate pedestal module which supports the semiconductor substrate in the reaction chamber. The showerhead module delivers process gas into the reactor chamber so that the semiconductor substrate may be processed. In such chambers installation and removal of the showerhead module can be time consuming, and further, non-uniform film deposition (i.e. azimuthal variation) during substrate processing can occur if a lower surface of the showerhead module is not parallel to an upper surface of the substrate pedestal module.

SUMMARY

Disclosed herein is a semiconductor substrate processing apparatus for processing semiconductor substrates. The semiconductor substrate processing apparatus comprises: a chemical isolation chamber in which individual semiconductor substrates are processed wherein a top plate forms an upper wall of the chemical isolation chamber; a process gas source in fluid communication with the chemical isolation chamber for supplying a process gas into the chemical isolation chamber; a showerhead module which delivers the process gas from the process gas source to a processing zone of the processing apparatus wherein the individual semiconductor substrates are processed, wherein the showerhead module comprises a base attached to a lower end of a stem wherein a faceplate having gas passages therethrough forms a lower surface of the base; a substrate pedestal module which is configured to support the semiconductor substrate in the processing zone below the faceplate during processing of the substrate; and a showerhead module adjustment mechanism which supports the showerhead module in the top plate wherein the showerhead module adjustment mechanism is dynamically operable to adjust the planarization of the faceplate of the showerhead module with respect to an upper surface of the substrate pedestal module adjacent the faceplate, wherein the showerhead module adjustment mechanism comprises at least one actuator assembly.

The showerhead module adjustment mechanism can comprise at least one actuator assembly, which dynamically allows movement of the showerhead module in at least one direction of tilt. The at least one actuator assembly can comprise a lever, which mechanically amplifies displacement of a piezoelectric stack and a flexure mount to couple the lever to an actuator housing. The at least one actuator assembly can further comprise an upper flexure portion coupled between an upper end of the piezoelectric stack and the actuator housing which contains the piezoelectric stack and, wherein the flexure mount is coupled to a bottom end of the piezoelectric stack and the lever, and wherein the upper flexure portion and the flexure mount are configured to reduce stress on the piezoelectric stack. The showerhead module adjustment mechanism can be configured such that: (a) three actuator assemblies to effect movement of the showerhead module in two directions of tilt and an axial translation; (b) an end of the lever opposite to the piezoelectric stack causes movement of an adjustment screw coupled to a top plate of a bellows assembly; (c) an end of the lever opposite to the piezoelectric stack acts on a ball joint of the adjustment screw via a socket-groove; (d) the showerhead module is attached to the top plate of the bellows assembly; (e) the flexure mount constrains the lever in lateral and vertical translations; (f) the combined thermal expansion of an upper flexure portion, flexure mount, and actuator housing matches the thermal expansion of the piezoelectric stack; or (g) the showerhead module adjustment mechanism dynamically adjusts tilt of the faceplate of the showerhead module over a range of approximately 3 milliradians. The showerhead module adjustment mechanism may also dynamically adjust a position of the faceplate of the showerhead module with a resolution of better than 0.15 milliradians.

In an embodiment of the actuator assembly, the at least one actuator assembly further comprises a lever, which mechanically amplifies displacement of a piezoelectric stack; a ball-and-socket joint coupled to the lever and a bottom end of the piezoelectric stack; and an upper flexure portion coupled between an upper end of the piezoelectric stack and an actuator housing containing the piezoelectric stack.

BRIEF DESCRIPTION OF THE DRAWING FIGURES

DETAILED DESCRIPTION

Figure 1:
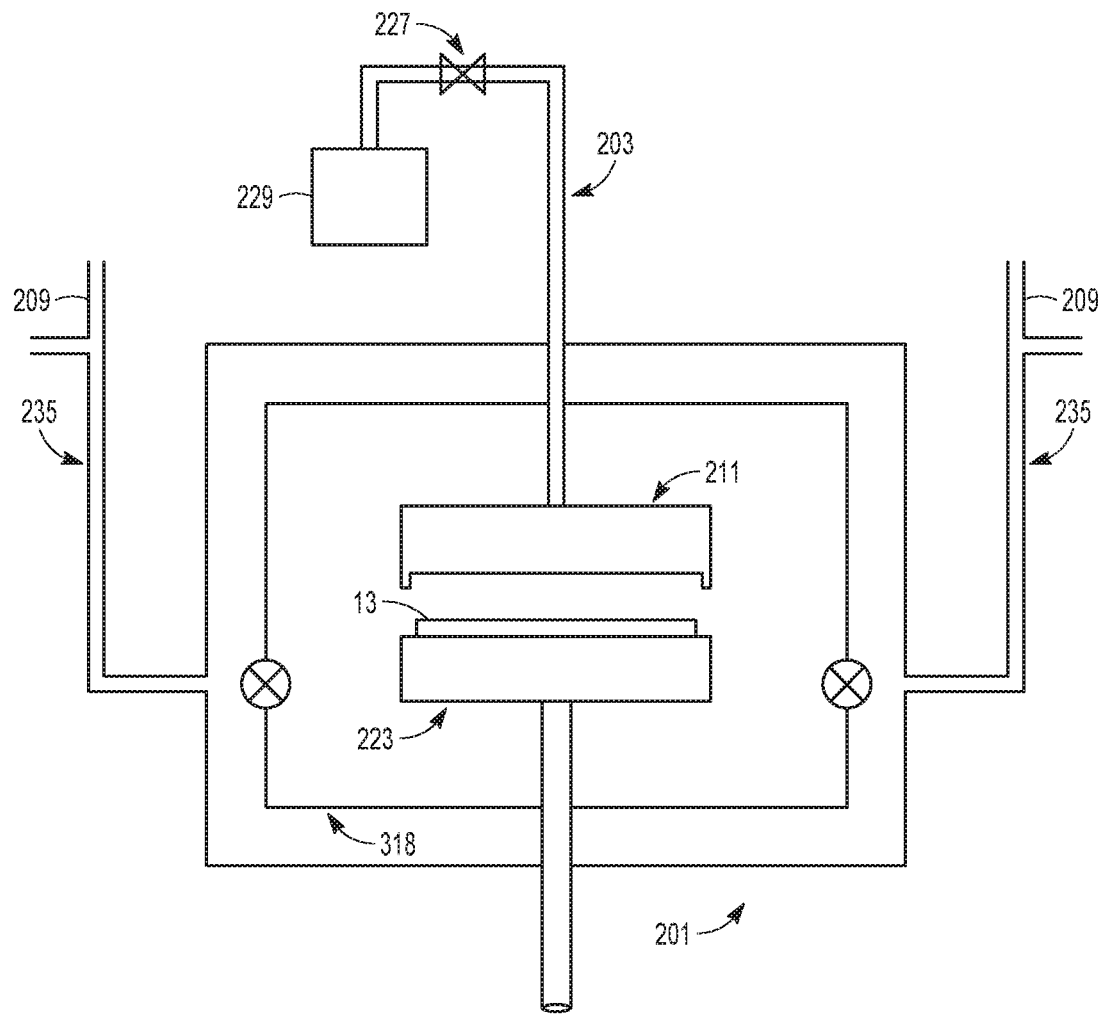
FIG. 1 illustrates a schematic diagram showing an overview of a chemical deposition apparatus in accordance with embodiments disclosed herein.

In the following detailed description, numerous specific embodiments are set forth in order to provide a thorough understanding of the apparatus and methods disclosed herein. However, as will be apparent to those skilled in the art, the present embodiments may be practiced without these specific details or by using alternate elements or processes. In other instances, well-known processes, procedures, and/or components have not been described in detail so as not to unnecessarily obscure aspects of embodiments disclosed herein. As used herein in connection with numerical values the term "about" refers to ±10%.

As indicated, present embodiments provide semiconductor substrate processing apparatuses such as deposition apparatuses (or in an alternate embodiment an etching apparatus) and associated methods for conducting a chemical vapor deposition such as a plasma enhanced chemical vapor deposition. The apparatus and methods are particularly applicable for use in conjunction with semiconductor fabrication based dielectric deposition processes or metal deposition processes which require separation of self-limiting deposition steps in a multi-step deposition process (e.g., atomic layer deposition (ALD), plasma enhanced atomic layer deposition (PEALD), plasma enhanced chemical vapor deposition (PECVD), pulsed deposition layer (PDL), molecular layer deposition (MLD), or plasma enhanced pulsed deposition layer (PEPDL) processing), however they are not so limited. Exemplary embodiments of methods of processing a semiconductor substrate can be found in commonly-assigned U.S. Published Patent Application Nos. 2013/0230987, 2013/0005140, 2013/0319329, and U.S. Pat. Nos. 8,580,697, 8,431,033, and 8,557,712, which are hereby incorporated by reference in their entirety.

The aforementioned processes can suffer from some drawbacks associated with non-uniform process gas delivery to an upper surface of a wafer or semiconductor substrate receiving deposited films from process gas such as a process gas precursor or reactant. For example, a non-uniform precursor distribution on the upper surface of the semiconductor substrate can form if a lower surface of a showerhead module which delivers process gas to the semiconductor substrate is not parallel to an upper surface of a substrate pedestal module which supports the semiconductor substrate.

There are generally two main types of CVD showerhead modules: the chandelier type and the flush mount type. The chandelier showerhead modules have a stem attached to a top plate of the reaction chamber on one end and a faceplate on the other end, resembling a chandelier. A part of the stem may protrude above the top plate to enable connection of gas lines and radio frequency ("RF") power. Flush mount showerhead modules are integrated into the top of a chamber and do not have a stem. Although the examples shown herein are of a chandelier type showerhead, the showerhead module is not limited to that type of showerhead.

Showerhead module leveling (planarization) is typically performed after a wet clean procedure that involves cooling and venting a reaction chamber (chemical isolation chamber) of the apparatus one or multiple times. The cooling and venting may be required to access the interior of the chamber to adjust the spacing between the showerhead and the substrate pedestal module as well as the planarization of a lower surface of the showerhead with respect to an upper surface of the pedestal module. A conventional technique involves placing metallic foil balls in the chamber to measure the gap between the showerhead module and the substrate pedestal module and then adjusting a number of standoffs, usually three or more, between a backing plate of the showerhead module and the top plate of the reaction chamber based on the measurements. The standoffs can only be adjusted by opening the top plate after venting and cooling the chamber. Multiple measuring and adjusting cycles may be performed before the showerhead module is considered level. Because the showerhead cannot be leveled through external manipulation, the process can be very time-consuming, up to about 20 hours.

In an embodiment, one or more piezoelectric actuators are used to provide an additional, dynamic fine adjust on top of this manual adjustment procedure. Processes often require films of different types to be laid down sequentially on the same wafer, and each film might have a different sensitivity to showerhead tilt. Piezoelectric actuators are ideal for this application because they are capable of controlling position changes in the sub-nanometer range by translating small changes in operating voltage into smooth movements. Movement controlled by piezoelectric actuators is not influenced by friction or threshold voltages. Piezoelectric actuators also offer fast response times, capable of acceleration rates greater than 10,000 g's. Piezoelectric actuators do not produce magnetic fields nor are they affected by magnetic fields; therefore, they are especially well suited for applications with low magnetic field tolerances. Finally, piezoelectric actuators have neither gears nor rotating shafts and thus their displacement is based on solid state dynamics and shows no wearing.

However, currently available motorized actuators and stages, including commercial piezoelectric stages, do not meet drive force (80 pound-force per actuator), resolution (0.15 milliradians), endurance (10,000,000 cycles), or tight packaging requirements needed for showerhead tilt adjustments. For example, motorized lead screw actuators either provide insufficient drive force (10-15 pound-force per actuator) or are too large to package in a semiconductor processing tool. Stand-alone piezoelectric stacks are able to provide sufficient drive force, but their maximum displacement is very small, typically on the order of 0.1% of their length. Other commercially available piezoelectric stages, designed for nanometer accuracy and almost zero cross coupling between directions, do not have sufficient range of motion or the required drive force.

Disclosed herein is a showerhead module coupled to a showerhead module adjustment mechanism, which is designed to be leveled from outside of the reaction chamber, between process steps on the same wafer. In processes where two or more different film materials are deposited sequentially, dynamically adjusting showerhead tilt corrects for azimuthal variation without breaking vacuum. The showerhead actuator assembly preferably incorporates a lever having a gain ratio between 2 and 20; for example, a desired gain ratio such as 6.5:1 may be used to enhance the range of motion of a stand-alone piezoelectric stack. Piezoelectric actuators comprising an integrated lever motion amplifier may increase piezoelectric stack displacement by a factor of typically 2 to 20. To maintain high resolution and fast response with the increased travel range, the leverage system is preferably stiff as well as backlash- and friction-free, which is why ball or roller bearings are not preferred. Piezoelectric actuators with integrated motion amplifiers have several advantages over standard piezoelectric actuators, including a guided motion, decoupling of forces from the ceramics; compact size compared to stack actuators with equal displacement; and reduced capacitance.

In a preferred configuration, the piezoelectric stack applies enough drive force (at least 80 pound-force) at the adjustment point even after drive force has been reduced by the lever. Furthermore, flexures ensure that the lever assembly functions without friction and wear, which is desired to extend actuator life. A flexure is a frictionless, stictionless device based on the elastic deformation (flexing) of a solid material. Sliding and rolling are entirely eliminated. In addition to absence of internal friction, flexure devices exhibit high stiffness and load capacity. Flexures are less sensitive to shock and vibration than other guiding systems and may also serve as stress-reducers for the piezoelectric stack and allow kinematic movement in the desired direction, thus enabling the actuator to achieve its full range of motion and further extending actuator life.

FIG. 1 is a schematic diagram showing an overview of a semiconductor substrate processing apparatus 201 for chemical vapor deposition in accordance with embodiments disclosed herein. A semiconductor substrate 13 such as a wafer sits on top of a movable pedestal module 223 that can be raised or lowered relative to a showerhead module 211, which may also be moved vertically. Reactant material gases are introduced into a processing zone 318 of the chamber via gas line 203 wherein the process gas flow is controlled by a mass flow controller 229. Note that the apparatus may be modified to have one or more gas lines, depending on the number of reactant gases used. The chamber is evacuated through vacuum lines 235 that are connected to a vacuum source 209. The vacuum source may be a vacuum pump.

Figure 2:
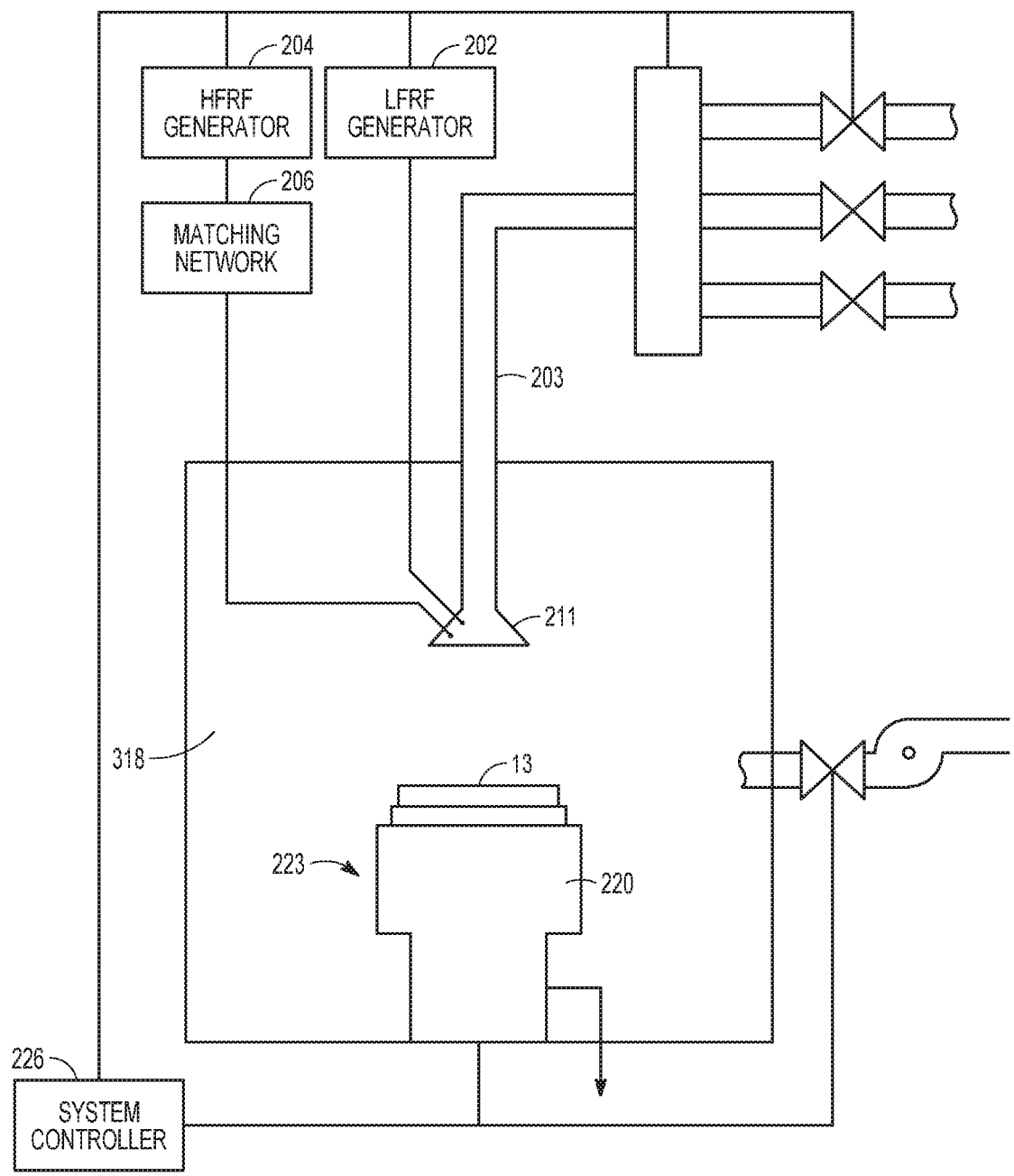
FIG. 2 illustrates a block diagram depicting various apparatus components arranged for implementing embodiments disclosed herein wherein plasma can be utilized to enhance deposition and/or surface reactions between reacting species during the generation of thin films.

Embodiments disclosed herein can be implemented in a plasma enhanced chemical deposition apparatus (i.e. plasma-enhanced chemical vapor deposition (PECVD) apparatus, plasma-enhanced atomic layer deposition (PEALD) apparatus, or plasma-enhanced pulsed deposition layer (PEPDL) apparatus). FIG. 2 provides a simple block diagram depicting various apparatus components arranged for implementing embodiments disclosed herein wherein plasma is utilized to enhance deposition. As shown, a processing zone 318 serves to contain the plasma generated by a capacitively coupled plasma system including a showerhead module 211 working in conjunction with a substrate pedestal module 223, wherein the substrate pedestal module 223 is heated. RF source(s), such as at least one high-frequency (HF) RF generator 204, connected to a matching network 206, and an optional low-frequency (LF) RF generator 202 are connected to the showerhead module 211. In an alternative embodiment, the HF generator 204 can be connected to the substrate pedestal module 223. The power and frequency supplied by matching network 206 is sufficient to generate a plasma from the process gas/vapor. In an embodiment both the HF generator and the LF generator are used, and in an alternate embodiment, just the HF generator is used. In a typical process, the HF generator is operated at frequencies of about 2-100 MHz; in a preferred embodiment at 13.56 MHz or 27 MHz. The LF generator is operated at about 50 kHz to 2 MHz; in a preferred embodiment at about 350 to 600 kHz. The process parameters may be scaled based on the chamber volume, substrate size, and other factors. Similarly, the flow rates of process gas may depend on the free volume of the vacuum chamber (reaction chamber) or processing zone.

Within the chamber, the substrate pedestal module 223 supports a substrate 13 on which materials such as thin films may be deposited. The substrate pedestal module 223 can include a fork or lift pins to hold and transfer the substrate during and between the deposition and/or plasma treatment reactions. In an embodiment, the substrate 13 may be configured to rest on a surface of the substrate pedestal module 223, however in alternate embodiments the substrate pedestal module 223 may include an electrostatic chuck, a mechanical chuck, or a vacuum chuck for holding the substrate 13 on the surface of the substrate pedestal module 223. The substrate pedestal module 223 can be coupled with a heater block 220 for heating substrate 13 to a desired temperature. Substrate 13 is maintained at a temperature of about 25° C. to 500° C. or greater depending on the material to be deposited.

In certain embodiments, a system controller 228 is employed to control process conditions during deposition, post deposition treatments, and/or other process operations. The controller 228 will typically include one or more memory devices and one or more processors. The processor may include a CPU or computer, analog and/or digital input/output connections, stepper motor controller boards, etc.

In certain embodiments, the controller 228 controls all of the activities of the apparatus. The system controller 228 executes system control software including sets of instructions for controlling the timing of the processing operations, frequency and power of operations of the LF generator 202 and the HF generator 204, flow rates and temperatures of precursors and inert gases and their relative mixing, temperature of the heater block 220 and showerhead module 211, pressure of the chamber, tilt of the showerhead, and other parameters of a particular process. Other computer programs stored on memory devices associated with the controller may be employed in some embodiments.

Typically there will be a user interface associated with controller 228. The user interface may include a display screen, graphical software displays of the apparatus and/or process conditions, and user input devices such as pointing devices, keyboards, touch screens, microphones, etc.

A non-transitory computer machine-readable medium can comprise program instructions for control of the apparatus. The computer program code for controlling the processing operations can be written in any conventional computer readable programming language: for example, assembly language, C, C++, Pascal, Fortran or others. Compiled object code or script is executed by the processor to perform the tasks identified in the program.

The controller parameters relate to process conditions such as, for example, timing of the processing steps, flow rates and temperatures of precursors and inert gases, temperature of the wafer, pressure of the chamber, tilt of the showerhead, and other parameters of a particular process. These parameters are provided to the user in the form of a recipe, and may be entered utilizing the user interface.

Signals for monitoring the process may be provided by analog and/or digital input connections of the system controller. The signals for controlling the process are output on the analog and digital output connections of the apparatus.

The system software may be designed or configured in many different ways. For example, various chamber component subroutines or control objects may be written to control operation of the chamber components necessary to carry out deposition processes. Examples of programs or sections of programs for this purpose include substrate timing of the processing steps code, flow rates and temperatures of precursors and inert gases code, and a code for pressure of the chamber.

The showerhead module 211 is preferably temperature controlled and RF powered. An exemplary embodiment of a temperature controlled RF powered showerhead module can be found in commonly-assigned U.S. Published Patent Application No. 2013/0316094 which is hereby incorporated by reference in its entirety.

Figure 3A:
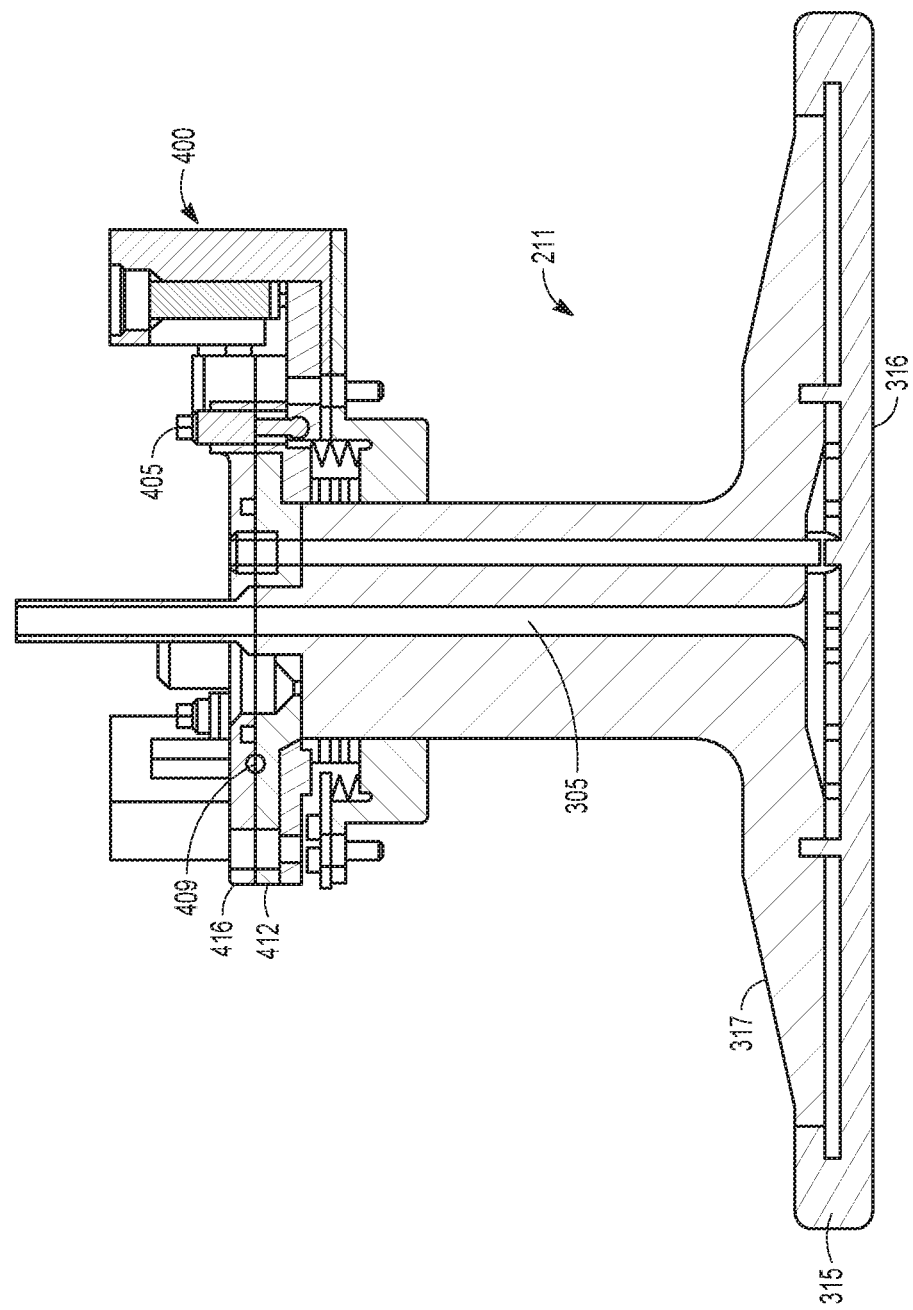
FIGS. 3A, 3B illustrate a showerhead module arranged in accordance with embodiments disclosed herein.
Figure 3B:
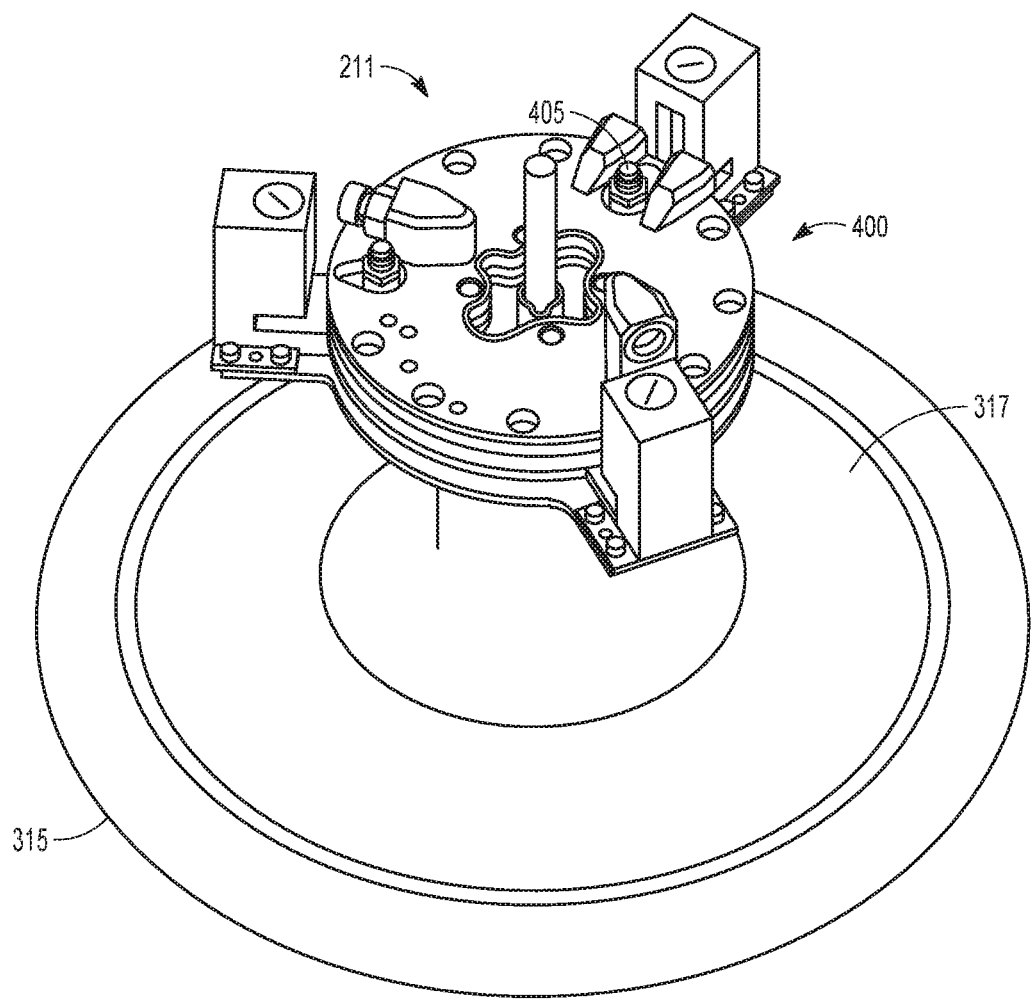

According to embodiments disclosed herein, the showerhead module preferably includes a showerhead module adjustment mechanism for manually and dynamically adjusting the planarization of the showerhead module. As illustrated in FIGS. 3A and 3B, a showerhead module 211 preferably includes a stem 305, a base 315 which includes a backing plate 317 and a faceplate 316 as well as the showerhead module adjustment mechanism 400 for adjusting the planarization of the showerhead module 211. The planarization of the showerhead module 211 can also be coarsely adjusted by tightening or loosening adjustment screws 405. Adjustment screws 405 comprise a fine thread and can be used to manually adjust the showerhead module 211 in two degrees of tilt and in axial position. The adjustment screws 405 mate with socket-groove 430 of the actuator assembly. The planarization of the showerhead module 211 can be finely and dynamically adjusted by manipulating piezoelectric stack displacement of a piezoelectric actuator via an integrated lever motion amplifier.

In one embodiment, planarization of the faceplate 316 of the showerhead module 211 can be adjusted using three actuator assemblies as part of a showerhead adjustment mechanism to dynamically provide three degrees of freedom: an axial translation and two directions of tilt. In another embodiment, two actuator assemblies may be used to provide two degrees of freedom. In yet another embodiment, one actuator assembly may be used to provide one degree of freedom (e.g. dynamic tilt in one direction). The showerhead module 221 and showerhead module adjustment mechanism 400 design uses a rapid response (e.g. less than one second) piezoelectric actuator assembly to dynamically adjust showerhead module 211 tilt, thus allowing improved uniformity in depositing a particular film selected from multiple different film types.

Figure 4:
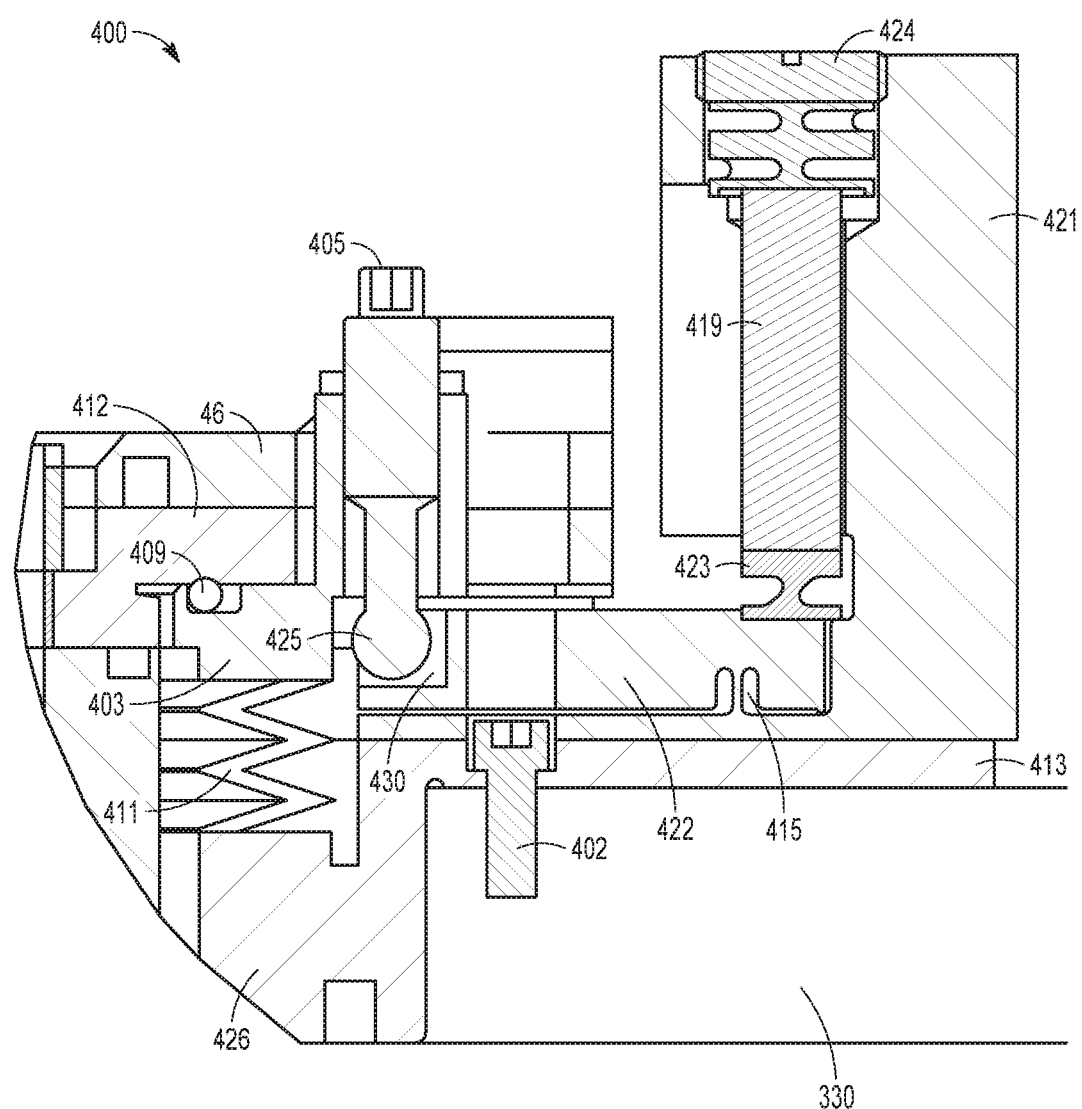
FIG. 4 illustrates a cross section of a showerhead module adjustment mechanism arranged in accordance with embodiments disclosed herein.

As illustrated in FIG. 4, the showerhead module 211 is preferably supported in a top plate 330 of the chemical isolation chamber (i.e. reaction chamber). The top plate 330 preferably supports a collar 413. A horizontal upper surface of the top plate 330 preferably has openings, such as threaded openings, wherein corresponding openings, for receiving fasteners, in the collar 413 include at least three fasteners 402 which attach the collar 413 to the top plate 330. The collar 413 supports the remainder of showerhead module adjustment mechanism 400 in the top plate 330. The showerhead module adjustment mechanism 400 is grounded by the top plate 330.

An O-ring 409 forms an airtight seal (i.e. a hermetic seal) between a top plate of bellows assembly 403 and a cooling plate 412 supported above the collar 413 by at least three adjustable adjustment screws 405 wherein the at least three adjustable adjustment screws 405 are also operable to coarsely adjust the planarization of the cooling plate 412 with respect to the collar 413. Preferably, an upper end of each adjustment screw 405 is threadedly supported in a top plate 403 of a bellows assembly and a lower end of each respective adjustment screw 405 (i.e. ball joint 425) is rotatably received in a socket-groove 430 of the actuator assembly. The showerhead stem 305 extends through an opening in the collar 413, the bellows 411, and the cooling plate 412, and attaches to the upper surface of the cooling plate 412 with another O-ring 409 forming a hermetic seal therebetween flange 416 and the cooling plate 412. Moreover, flange 416 and cooling plate 412 may be jointly brazed. The stem 305 of the showerhead module 211 is supported in an opening of the top plate 330 by fasteners 402 attaching the collar 413 to the top plate 330.

The bellows 411 preferably forms an airtight expandable and flexible vacuum seal between the collar 413 and the cooling plate 412 wherein the stem 305 extends through the airtight expandable vacuum seal such that the planarization of the showerhead module 211 can be adjusted without breaking the airtight expandable vacuum seal. The bellows 411 is preferably welded at an upper end to the top plate 403 and at a lower end to the collar 413.

The showerhead module adjustment mechanism 400 may be attached to the top plate 330 of a chemical isolation chamber via three or more fasteners 402. The showerhead adjustment mechanism may contain between one and three actuator assemblies. Each actuator assembly provides one degree of motion. Three actuator assemblies would give three degrees of motion: two tilts and axial position. A cost-reduced version would use one actuator to provide tilt in one dimension.

Figure 5A:
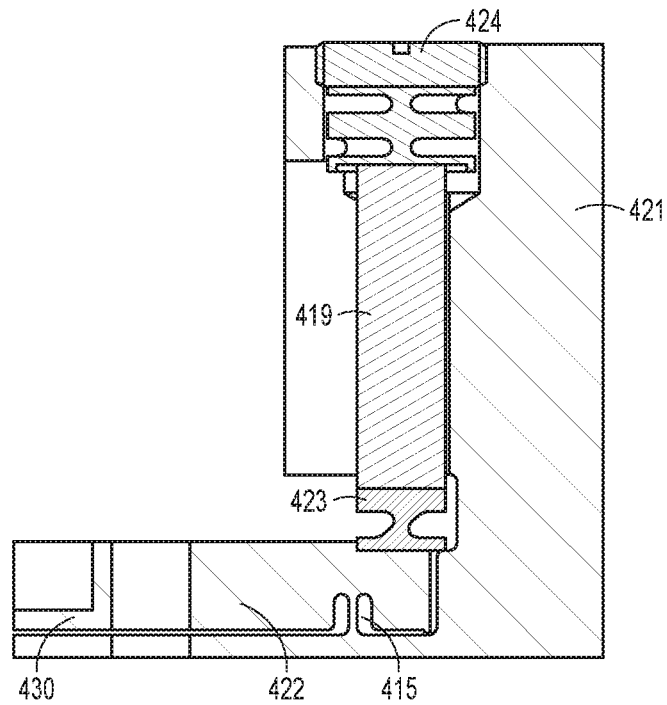
FIGS. 5A, 5B, 5C illustrate an actuator assembly arranged in accordance with an embodiment disclosed herein.
Figure 5B:
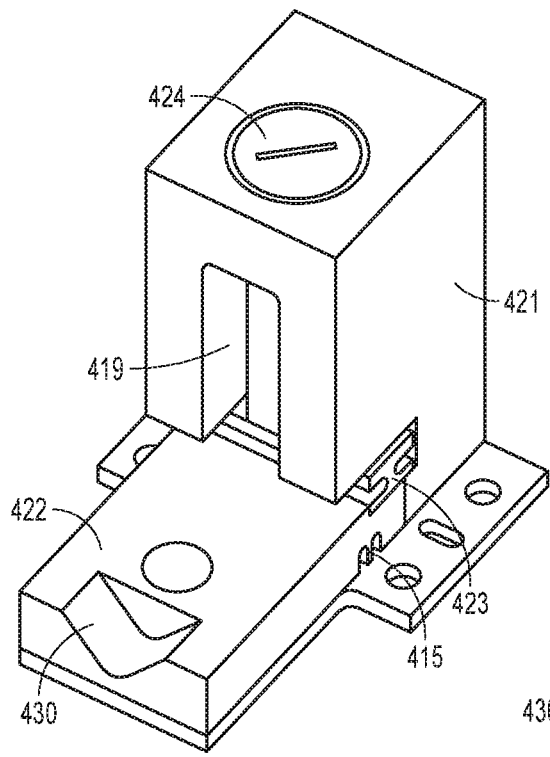
Figure 5C:
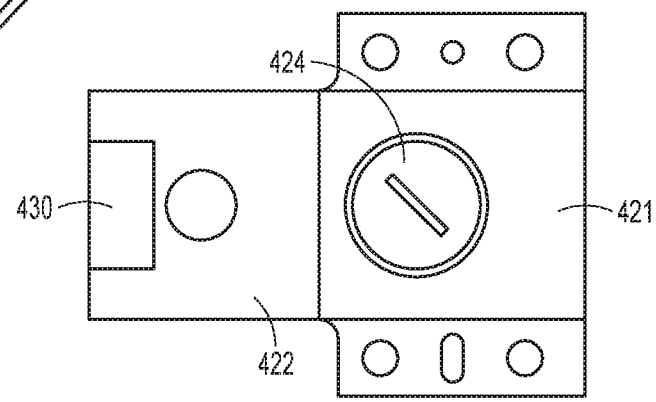

FIGS. 5A-5C illustrate one embodiment of the actuator assembly. In each actuator assembly, a piezoelectric stack 419 is mounted in an actuator housing 421. The piezoelectric stack 419 is made from a material whose length increases when voltage is applied; the change in length is approximately linear with voltage, and is about 0.1% at 100V. Because piezoelectric stacks alone provide only this small amount of motion, a lever 422 is fabricated into the actuator housing 421 to amplify the range of motion of the showerhead module adjustment mechanism 400 and at the same time, reduce the force by at least 2:1, preferably by at least 4:1, and in a preferred embodiment, by 6.5:1. A higher or lower ratio for the lever gain may be used. For example, a higher ratio allows for a greater range of motion but less force; a lower ratio provides more force but a lesser range of motion. The lever 422 is typically made using an electrical discharge machine (EDM). The lever pivot (i.e. fulcrum) is a blade flexure 415 which is designed to bend.

An electrical discharge machine (EDM)-cut flexure comprising a flexure mount 423 and an upper flexure portion 424 (for example, part of a threaded retainer) is housed in the actuator housing 421 and allows the lever 422 a small amount of tilt while constraining the lever 422 in other directions. The flexure mount 423 provides a low-stress connection between the piezoelectric stack 419 and the lever 422 of the actuator housing 421 and is designed to be compliant in bending, yet very stiff in compression. In this implementation, the flexure mount 423 is a cross-blade flexure. The flexure mount 423 may be fabricated using rapid prototype techniques such as direct metal laser sintering (DMLS). DMLS or other rapid prototype techniques are preferable for rapidly machining highly complex geometries that cannot be easily fabricated using conventional machining techniques, such as milling.

The upper flexure portion 424 is part of a threaded retainer which screws into the actuator housing 421 using a fine pitch thread until the piezoelectric stack 419 is lightly squeezed between the flexure mount 423 and the retainer. Thus, the threaded retainer is able to take up assembly tolerances between the actuator housing 421, piezoelectric stack 419, and flexure mount 423. The threaded retainer is also designed to be compliant in bending, but very stiff in compression. Flexure mount 423 and upper flexure portion 424 on a lower and upper end of the piezoelectric stack 419, respectively, are required to reduce stress and eliminate friction on the piezoelectric stack 419 and to allow it the kinematic degrees of freedom needed to drive the lever 422.

The blade flexure 415 provides a frictionless pivot for the lever 422, thereby resulting in increased accuracy and higher reliability in the operation of lever 422. Furthermore, the combination of the piezoelectric stack and EDM-cut flexure allows the actuator to achieve high displacement and high drive force. The end of the lever 422 opposite the piezoelectric stack 419 acts on a ball joint 425 of the adjustment screw 405 via a socket-groove 430. The ball joint 425, in turn, acts on a top plate 403 of a bellows assembly to adjust the planarization of faceplate 316 of the showerhead module 211, which is attached to the top plate 403 of the bellows assembly. The bellows assembly consists of a top plate 403, a bottom plate 426, and a bellows 411 which are welded together. The bottom plate 426 attaches to the top plate 330 of the chamber and the top plate 403 of the bellows assembly attaches to the cooling plate 412 which attaches to the showerhead. The bellows assembly is compliant; the top plate 403 can move with respect to the bottom plate 426 as the bellows 411 flexes.

The adjustment screw 405 may also be used for coarse adjustment of the showerhead module 211 position. The combination of coarse screw adjustment and the fine piezoelectric actuator dynamic adjustment allows the showerhead module 211 to be manually adjusted over wide displacement ranges to take up manufacturing tolerances and then dynamically adjusted between process steps.

Materials were chosen to athermalize the actuator so the tilt of the showerhead module 211 does not fluctuate over the wide operating temperature ranges experienced in deposition processes. Materials such as Invar, Nitronic 60, and titanium are chosen such that the combined thermal expansion of the actuator housing, threaded retainer, and flexure mount match the thermal expansion of the piezoelectric stack.

Figure 6A:
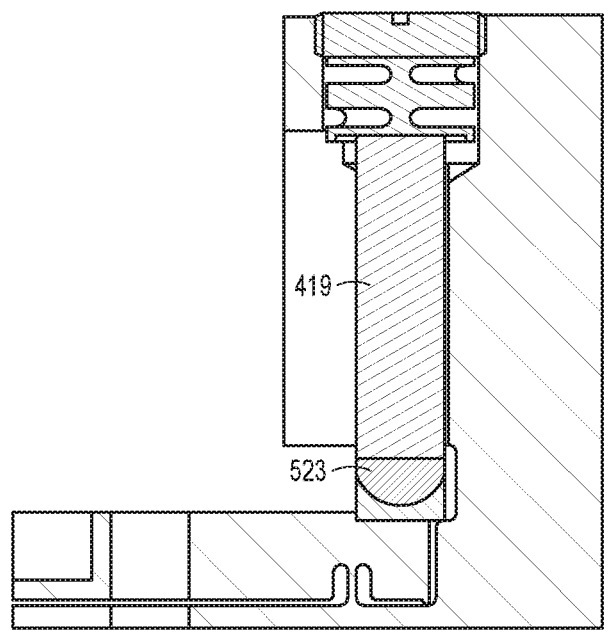
FIGS. 6A, 6B illustrate an actuator assembly arranged in accordance with embodiments disclosed herein.
Figure 6B:
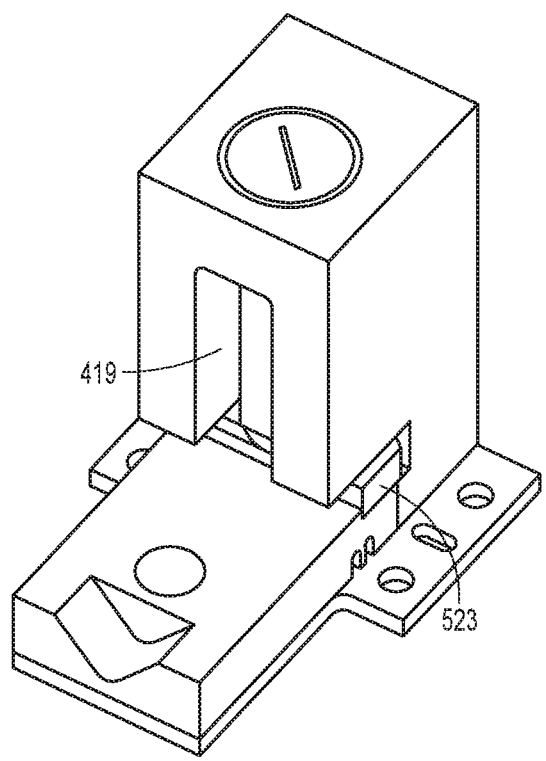

FIGS. 6A and 6B illustrate another embodiment of the actuator assembly. In each actuator assembly, a ball-and-socket joint 523 on the lower end of piezoelectric stack 419 may be advantageous where the flexure mount (FIGS. 5A-5C) cannot be fabricated. In the configuration of FIGS. 6A and 6B, the piezoelectric stack 419 has the same kinematic degrees of freedom as when the flexure mount 423 is used. The ball-and-joint configuration provides a low-stress connection between the piezoelectric stack and the lever of the actuator housing by allowing a pivoting motion, while still being stiff in compression. Wear may be reduced by using a Gothic arch type geometry to maximize contact area and reduce Hertz stresses, and also by using a material such as Nitronic 60 that is resistant to galling.

The embodiments shown in FIGS. 5A-6B allow dynamic adjustment of the showerhead module 211 so as to control the gap height between the faceplate 316 and an upper surface of the substrate pedestal module 223. Tilting the showerhead affects the thickness profile of the film deposited on the substrate. Because different films have different sensitivities to showerhead tilt, dynamic adjustment of the showerhead tilt without breaking vacuum is advantageous in terms of production efficiency and maintenance costs. The embodiments shown in FIGS. 5A-6B also meet drive force (80 pound-force per actuator), resolution (0.15 milliradians), endurance (10,000,000 cycles), and range of motion (3 milliradians) requirements needed from modern showerhead adjustment mechanisms.

Preferably, the system controller 228 is electronically connected to at least one in-situ sensor (detector) for measuring the gap height between the faceplate 316 and an upper surface of the substrate pedestal module 223 as well as the planarity of the faceplate 316 with respect to the upper surface of the substrate pedestal module 223, such that gap control and planarization control can be performed in a feedback control mode. Various types of in-situ detectors, such as laser interferometer, inductive, capacitive, acoustic, linear variable differential transformer (LDVT), and strain gauge sensors can be used as a gap and planarity sensor wherein the sensor can be located either inside or outside the chemical isolation chamber. The sensor may be integrated into the actuator, thus allowing closed-loop feedback control and also providing a means of detecting a non-functioning actuator.

While the semiconductor substrate processing apparatus including the baffle arrangement has been described in detail with reference to specific embodiments thereof, it will be apparent to those skilled in the art that various changes and modifications can be made, and equivalents employed, without departing from the scope of the appended claims.

What is claimed is:

1. A showerhead adjustment mechanism to adjust a showerhead in a semiconductor substrate-processing apparatus, the showerhead adjustment mechanism comprising:
at least one actuator assembly that is dynamically operable to adjust parallelism of a faceplate of the showerhead with reference to an upper surface of a substrate pedestal to be positioned adjacent to the faceplate, each of the at least one actuator assemblies including:
a piezoelectric stack;
a lever having a first end and a second end, the lever being mechanically coupled on the first end to the piezoelectric stack and on the second end to the showerhead to displace the showerhead in at least one direction of tilt, the lever being operable to amplify mechanically a displacement of the piezoelectric stack;
a socket in the second end of the lever to act on a ball joint coupled to the showerhead dynamically to move the showerhead in at least one direction of tilt; and
a lever pivot coupled to the lever and located between the first end and the second end of the lever.

2. The showerhead adjustment mechanism of claim 1, wherein the adjustment of the showerhead is to control at least one gap distance between the faceplate of the showerhead and the upper surface of the substrate pedestal.

3. The showerhead adjustment mechanism of claim 2, further comprising at least one in-situ sensor to measure the at least one gap distance and the parallelism of the faceplate with reference to the upper surface of the substrate pedestal.

4. The showerhead adjustment mechanism of claim 1, wherein the lever pivot comprises a blade flexure to act as a frictionless fulcrum based on elastic deformation of a solid material.

5. The showerhead adjustment mechanism of claim 1, wherein a gain ratio of the lever is between about 2:1 and about 20:1.

6. The showerhead adjustment mechanism of claim 1, wherein a gain ratio of the lever is about 6.5:1.

7. The showerhead adjustment mechanism of claim 1, wherein each of the at least one actuator assemblies correlates to at least one degree-of-freedom of movement.

8. The showerhead adjustment mechanism of claim 1, further comprising a flexure mount coupled between the first end of the piezoelectric stack and the first end of the lever.

9. The showerhead adjustment mechanism of claim 1, wherein the parallelism of the faceplate of the showerhead with reference to the upper surface of a substrate pedestal is to be adjusted from outside of a reaction chamber in which the showerhead is located without breaking a level of vacuum of the reaction chamber.

10. The showerhead adjustment mechanism of claim 1, wherein the adjustment is configured to be made between subsequent process steps on a substrate mounted to the substrate pedestal.

11. The showerhead adjustment mechanism of claim 1, wherein the showerhead adjustment mechanism is configured dynamically to adjust a position of the faceplate of the showerhead with a resolution of less than 0.15 milliradians.

12. The showerhead adjustment mechanism of claim 1, wherein the lever pivot is located on a side of lever that is on a side opposite to a point of contact between the first end of the piezoelectric stack and the lever.

13. A showerhead adjustment mechanism to adjust a showerhead in a semiconductor substrate-processing apparatus, the showerhead adjustment mechanism comprising:
 at least one actuator assembly that is dynamically operable to adjust parallelism of a faceplate of the showerhead with reference to an upper surface of a substrate pedestal to be positioned adjacent to the faceplate, each of the at least one actuator assemblies including:
  a piezoelectric stack;
  a lever having a first end and a second end, the lever being mechanically coupled on a first end to the piezoelectric stack and including a socket on the second end to the showerhead to displace the showerhead in at least one direction of tilt, the lever being operable to mechanically amplify a displacement of the piezoelectric stack;
  a socket in the second end of the lever to act on a ball joint coupled to the showerhead dynamically to move the showerhead in at least one direction of tilt; and
  a blade flexure to act as a frictionless fulcrum based on elastic deformation of a solid material, the blade flexure being coupled to the lever and located between the first end and the second end of the lever.

14. The showerhead adjustment mechanism of claim 13, wherein the piezoelectric stack comprises a material whose length increases substantially linearly with an increase in applied voltage.

15. The showerhead adjustment mechanism of claim 13, wherein the lever is to amplify a range of motion of the showerhead by at least about 2:1.

16. The showerhead adjustment mechanism of claim 13, wherein the lever is to amplify a range of motion of the showerhead by at least about 4:1.

17. The showerhead adjustment mechanism of claim 13, wherein the lever is to amplify a range of motion of the showerhead by at least about 6.5:1.

18. A showerhead adjustment mechanism to adjust a showerhead in a semiconductor substrate-processing apparatus, the showerhead adjustment mechanism comprising:
 at least one actuator assembly that is dynamically operable to adjust parallelism of a faceplate of the showerhead with reference to an upper surface of a substrate pedestal to be positioned adjacent to the faceplate, each of the at least one actuator assemblies including:
  a piezoelectric stack;
  a lever having a first end and a second end, the lever being mechanically coupled on the first end to the piezoelectric stack and on the second end to the showerhead to displace the showerhead in at least one direction of tilt, the lever being operable to mechanically amplify a displacement of the piezoelectric stack;
  a socket in the second end of the lever to act on a ball joint coupled to the showerhead dynamically to move the showerhead in at least one direction of tilt; and
  a lever pivot coupled to the lever and located between the first end and the second end of the lever; and
 at least one in-situ sensor to measure a gap distance and the parallelism of the faceplate with reference to the upper surface of the substrate pedestal.

19. The showerhead adjustment mechanism of claim 18, wherein the at least one in-situ sensor includes at least one sensor selected from sensors including a laser interferometer, a linear variable differential transformer, and one or more strain gauge sensors.

* * * * *